US009705489B2

(12) United States Patent
van Otten et al.

(10) Patent No.: US 9,705,489 B2
(45) Date of Patent: Jul. 11, 2017

(54) CASCODE TRANSISTOR CIRCUIT

(71) Applicant: NXP B.V., Eindhoven (NL)

(72) Inventors: Ralf van Otten, Eindhoven (NL); Franciscus Schoofs, Valkenswaard (NL); Matthias Rose, Helmond (NL); Hendrik Bergveld, Eindhoven (NL)

(73) Assignee: Nexperia B.V., Eindhoven (NL)

( * ) Notice: Subject to any disclaimer, the term of this patent is extended or adjusted under 35 U.S.C. 154(b) by 65 days.

(21) Appl. No.: 14/835,403

(22) Filed: Aug. 25, 2015

(65) Prior Publication Data
US 2016/0094218 A1 Mar. 31, 2016

(30) Foreign Application Priority Data

Sep. 25, 2014 (EP) .................................... 14186451

(51) Int. Cl.
H03K 17/687 (2006.01)
H03K 17/10 (2006.01)
H03K 17/16 (2006.01)
H03K 17/042 (2006.01)

(52) U.S. Cl.
CPC ......... *H03K 17/687* (2013.01); *H03K 17/102* (2013.01); *H03K 17/163* (2013.01); *H03K 17/6871* (2013.01); *H03K 17/04206* (2013.01); *H03K 2017/6875* (2013.01); *H03K 2217/0081* (2013.01)

(58) Field of Classification Search
None
See application file for complete search history.

(56) References Cited

U.S. PATENT DOCUMENTS

| 9,479,159 | B2 * | 10/2016 | Zojer ................... H03K 17/687 |
| 2002/0153938 | A1 * | 10/2002 | Baudelot ............... H01L 27/098 |
| | | | 327/430 |
| 2007/0170897 | A1 | 7/2007 | Williams |
| 2009/0251197 | A1 | 10/2009 | Friedricks |

(Continued)

FOREIGN PATENT DOCUMENTS

| EP | 2 448 102 A1 | 5/2012 |
| EP | 2 693 639 A1 | 2/2014 |
| WO | 2011/149632 A2 | 12/2011 |

OTHER PUBLICATIONS

Extended European Search Report for EP Patent Appln. No. 14186451.2 (Apr. 1, 2015).

*Primary Examiner* — Tuan T Lam
(74) *Attorney, Agent, or Firm* — Ohlandt, Greeley, Ruggiero & Perle, L.L.P.

(57) ABSTRACT

A cascode transistor circuit comprising a depletion-mode switch in series with a normally-off switch between a drain output terminal and a source output terminal. The circuit also includes a controller comprising a controller output terminal configured to provide a normally-on control signal for a normally-on control terminal of the depletion-mode switch, wherein the normally-on control signal is independent of the normally-off control signal; a negative voltage source configured to provide a negative voltage to the normally-on control terminal of the depletion-mode switch; and a feedback capacitance between the drain output terminal and a control node in a circuit path between the controller output terminal and the normally-on control terminal of the depletion-mode switch.

15 Claims, 5 Drawing Sheets

(56) References Cited

U.S. PATENT DOCUMENTS

Figure 1:
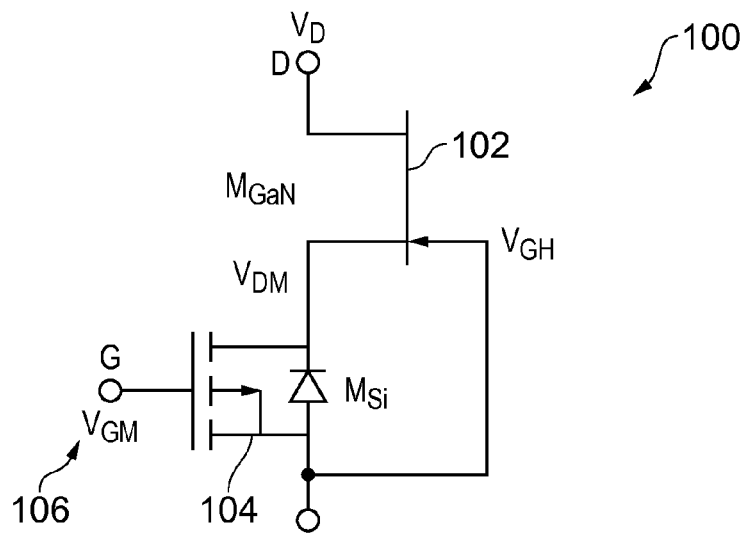

| | | | |
|---|---|---|---|
| 2013/0200926 A1* | 8/2013 | Kihara | H03K 17/063 327/108 |
| 2013/0335134 A1 | 12/2013 | Kanazawa et al. | |
| 2014/0035626 A1 | 2/2014 | Draxelmayer et al. | |
| 2014/0375292 A1* | 12/2014 | Kihara | H02M 1/08 323/283 |

* cited by examiner

CASCODE TRANSISTOR CIRCUIT

CROSS-REFERENCE TO RELATED APPLICATIONS

This application claims the priority under 35 U.S.C. §119 of European patent application no. 14186451.2, filed on Sep. 25, 2014, the contents of which are incorporated by reference herein.

This disclosure relates to cascode transistor circuits, and in particular to cascode transistor circuits that include a series connection of a normally-on power switch and a normally-off power switch.

According to a first aspect there is provided a cascode transistor circuit comprising:
- a drain output terminal;
- a source output terminal;
- a depletion-mode switch comprising a normally-on control terminal and a normally-on conduction channel;
- a normally-off switch comprising a normally-off control terminal and a normally-off conduction channel, wherein the normally-off control terminal is configured to receive a normally-off control signal, and wherein the normally-off conduction channel is connected in series with the normally-on conduction channel between the drain output terminal and the source output terminal;
- a controller comprising a controller output terminal configured to provide a normally-on control signal for the normally-on control terminal of the depletion-mode switch, wherein the normally-on control signal is independent of the normally-off control signal;
- a negative voltage source configured to provide a negative voltage to the normally-on control terminal of the depletion-mode switch;
- a feedback capacitance between the drain output terminal and a control node in a circuit path between the controller output terminal and the normally-on control terminal of the depletion-mode switch.

Such a cascode transistor circuit can advantageously present an overall normally-off switch behaviour, and also enable the rate of change of voltage (dV/dt) of the voltage across the cascoded switch to be adequately controlled during a switching operation. Such control can be particularly beneficial for satisfying electromagnetic compatibility (EMC) requirements.

The depletion-mode switch may comprise a FET, which may be a GaN or a SiC FET.

The normally-on control signal may be a current signal. The feedback capacitance and/or the current signal may be configured to control the rate of change of voltage at the drain output terminal (dV/dt) in accordance with the current of the normally-on control signal.

The normally-on control signal may be a first fixed current signal for switching on the depletion-mode switch. The normally-on control signal may be a second fixed current signal for switching off the depletion-mode switch. The first fixed current signal may be of opposite polarity to the second fixed current signal, The feedback capacitance may be substantially constant over an expected voltage range across the normally-on conduction channel or for an expected output voltage.

The feedback capacitance may comprise a capacitance between the controller output terminal and the drain output terminal. The feedback capacitance may comprise a capacitance between the normally-on control terminal and the drain output terminal.

The capacitance may comprise a component that is independent of the depletion-mode switch. The capacitance may be a discrete component. Additionally, or alternatively, the capacitance may comprise a parasitic capacitance of the depletion-mode switch.

The negative voltage source may comprise a bootstrap circuit connected between the controller output terminal and the normally-on control terminal of the depletion-mode switch. The bootstrap circuit may comprise a bootstrap capacitor and a bootstrap rectifier. The bootstrap capacitor may be connected in series between the controller output terminal and the normally-on control terminal of the depletion-mode switch. The bootstrap rectifier may be connected in series between the normally-on control terminal of the depletion-mode switch and the source output terminal.

The cascode transistor circuit may further comprise a charge pump capacitance in parallel with the bootstrap capacitor. The charge pump capacitance may be configured to maintain a negative voltage across the bootstrap capacitor when the cascode transistor circuit is off.

The normally-off control signal may be configured to control the normally-off switch such that it is turned on during normal operation. The normally-off switch may be a silicon MOSFET.

The cascode transistor circuit may further comprise a UVLO circuit configured to provide the normally-off control signal such that the normally-off control signal is arranged to turn the normally-off switch off before and during start-up, and optionally during any fault condition, and turn the normally-off switch on after one or more voltages within the cascode transistor circuit satisfy one or more associated threshold values.

The depletion-mode switch may be provided on a first die. The normally-off switch may be provided on a second, different, die. The controller and/or one or more other control blocks may also be provided on the second die.

There may be provided a power converter comprising any cascode transistor circuit disclosed herein.

There may be provided in integrated circuit comprising any cascode transistor circuit or power converter disclosed herein.

Figure 2:
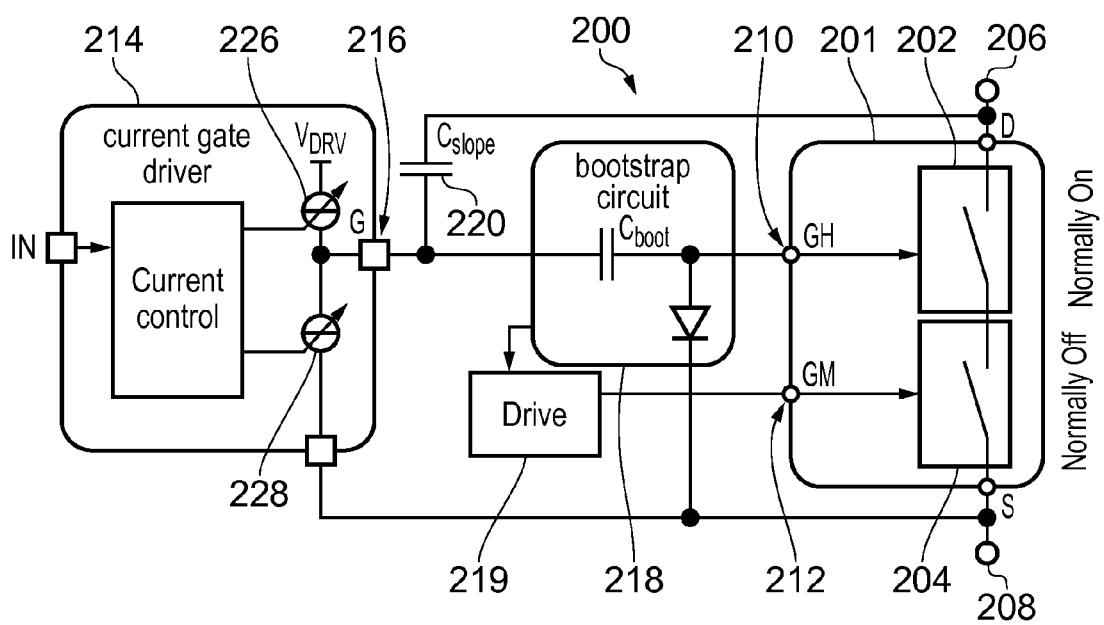
Figure 3:
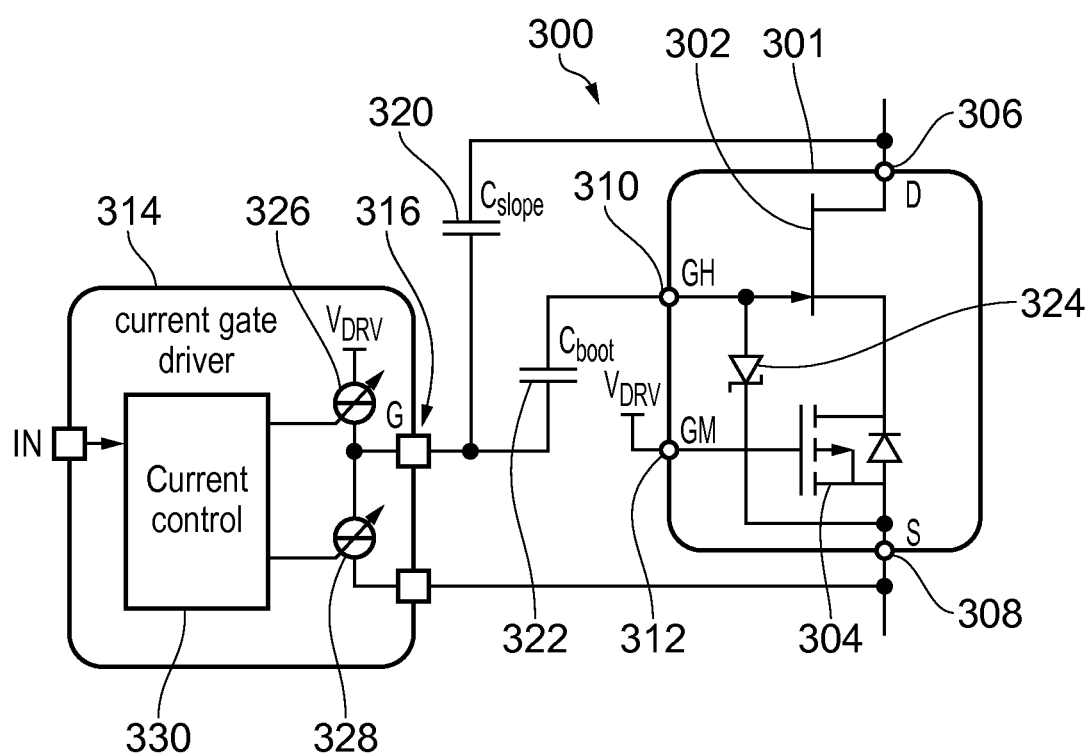
Figure 4:
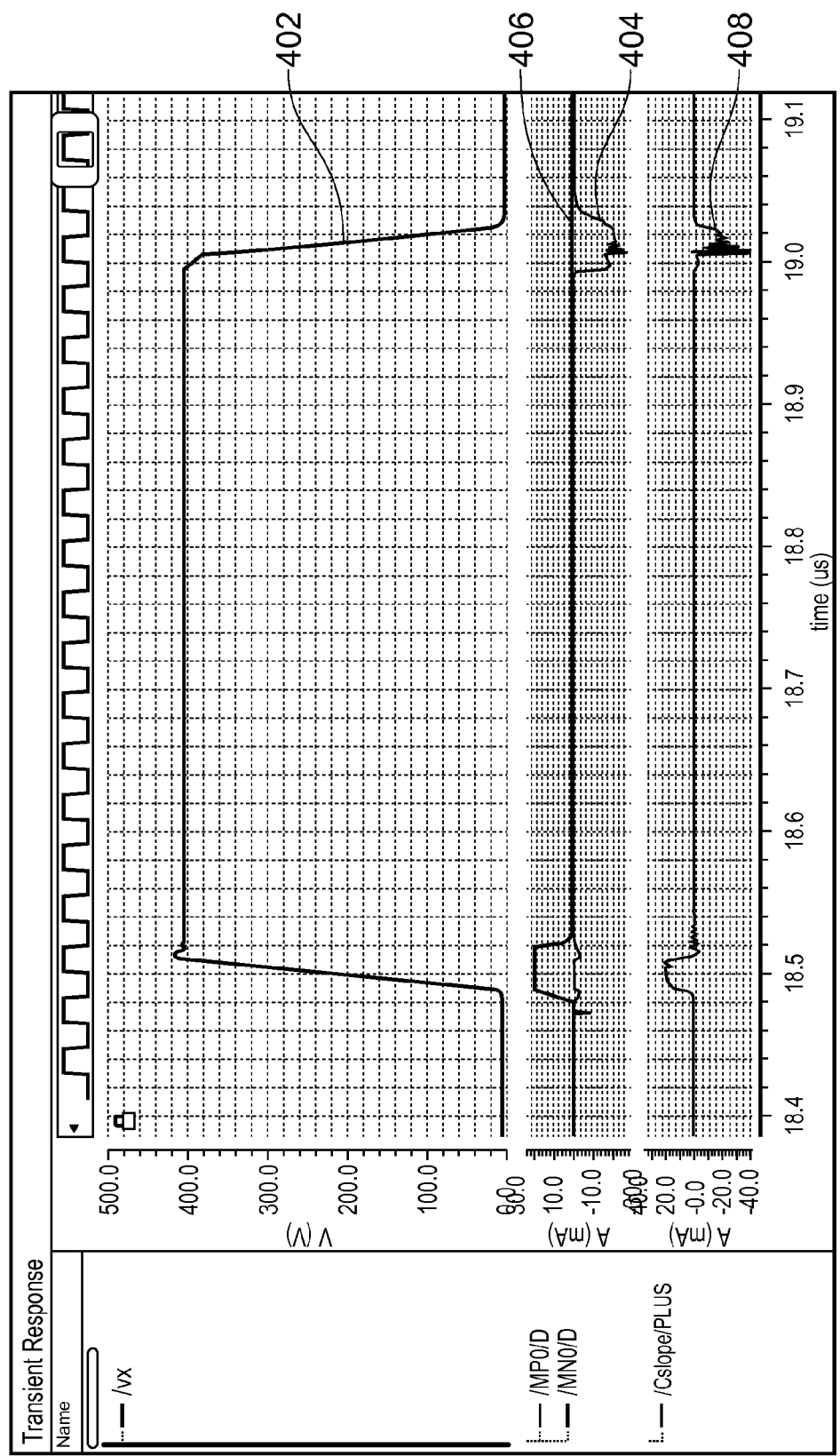
Figure 5:
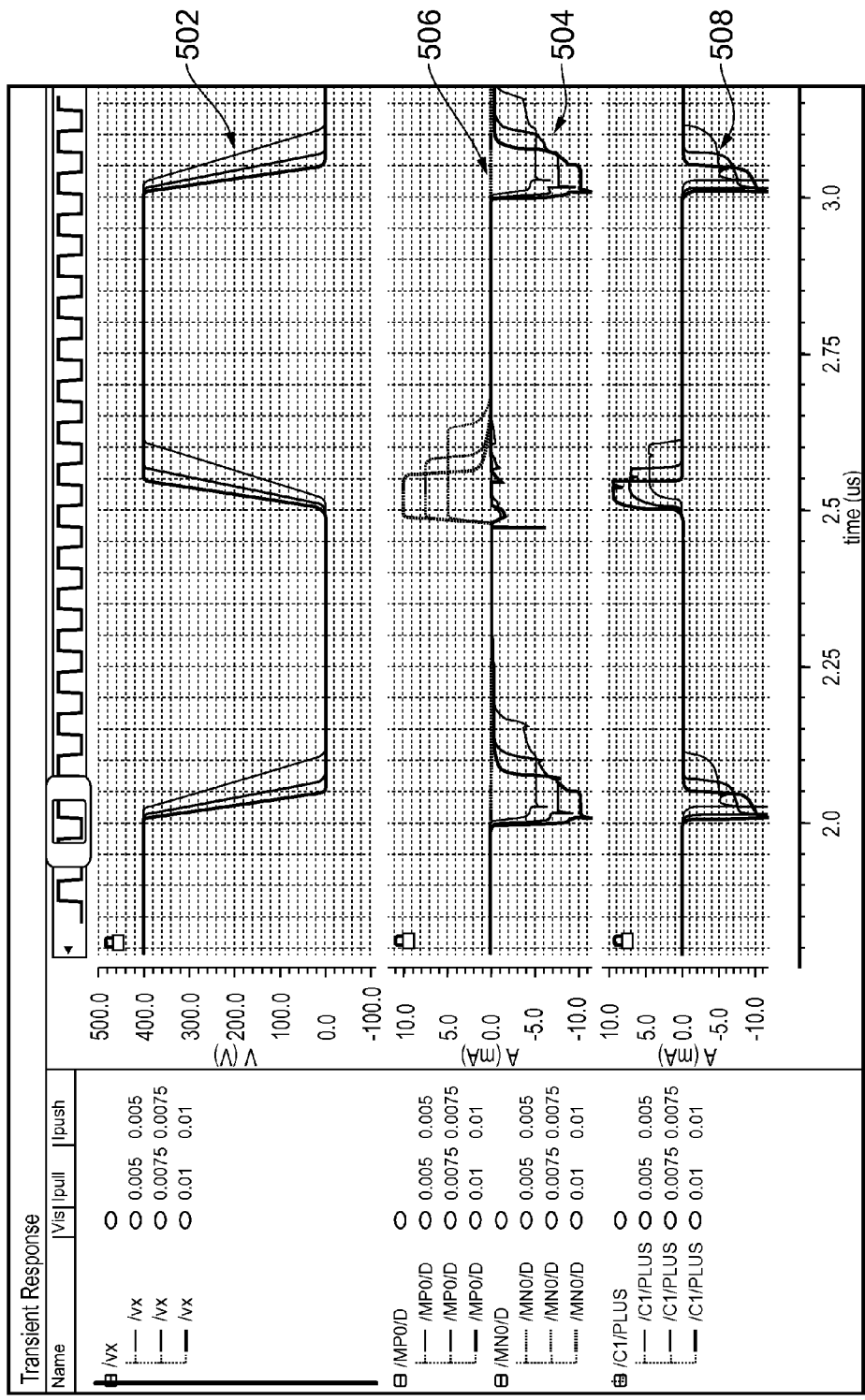
Figure 6:
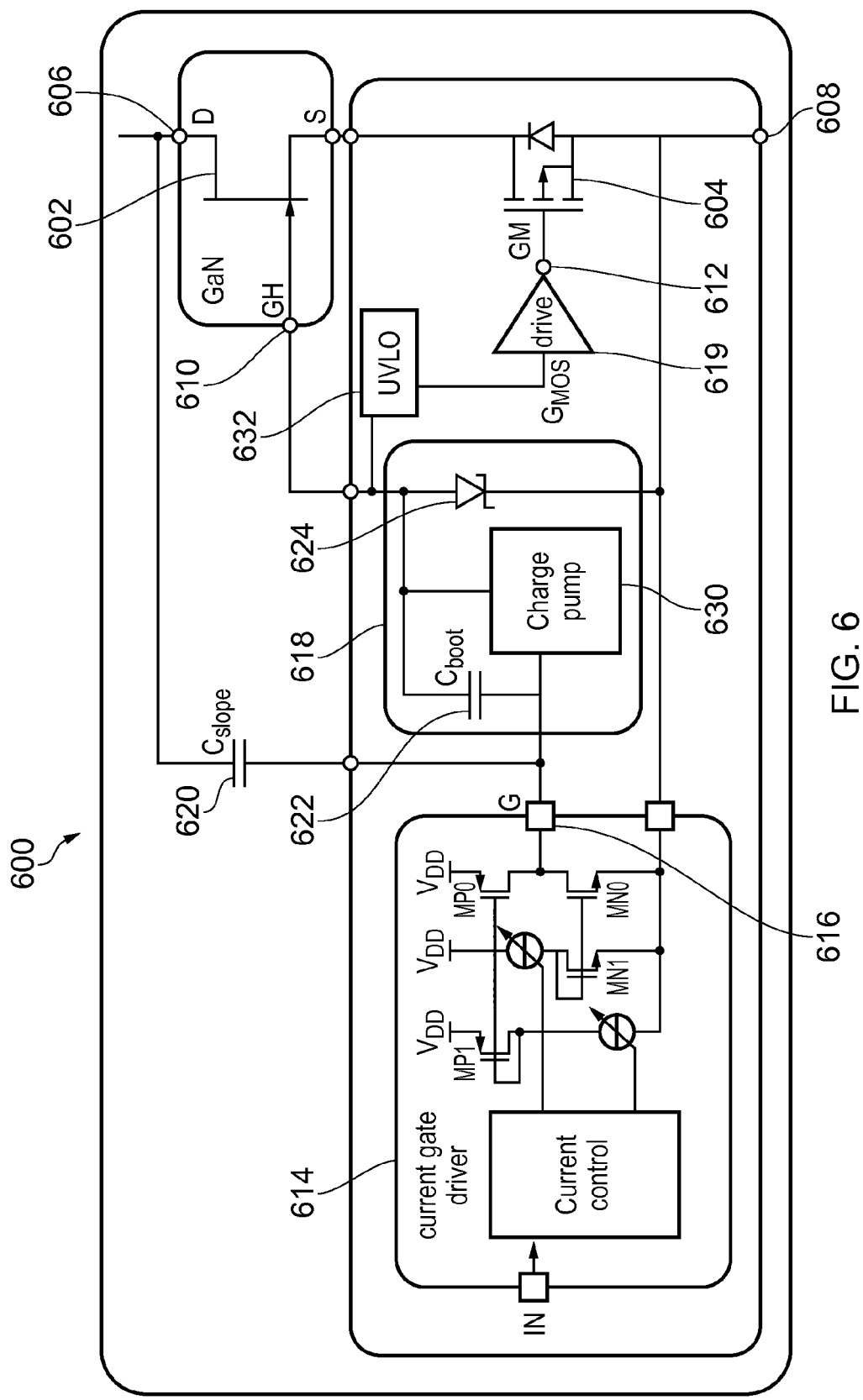

Embodiments of the invention will now be described by way of example, and with reference to the enclosed drawings in which:

FIG. 1 shows a cascade transistor circuit;
FIG. 2 shows another cascade transistor circuit;
FIG. 3 illustrates a further still cascade transistor circuit;
FIG. 4 shows simulation results for the circuit of FIG. 3;
FIG. 5 shows a plurality of simulation results for the circuit of FIG. 3; and
FIG. 6 illustrates a further example of a cascade transistor circuit.

One or more examples disclosed herein relate to an electronic control circuit to drive cascoded power semiconductors with a controlled voltage slope on the drain. Emerging new power switches based on SiC/GaN can have depletion-mode (normally-on) behaviour. Hence, they cannot be used in most power converter applications because they are turned on if the gate is unbiased and hence cause undesired fault conditions in an associated application. A solution to realize an inherently safe power switch is to combine an enhancement-mode (normally-off) power switch with these depletion mode (normally-on) power switches in a cascade configuration. As discussed in detail below, one or more of the control circuits disclosed herein can allow an active control of the slope of the voltage across a cascoded switch configuration using an additional capacitor.

FIG. 1 shows a cascade transistor circuit 100 that includes a series connection of a normally-on power switch 102 (MGaN) and a normally-off power switch 104 (MSi). The normally-on power switch 102 in this example is provided as a gallium nitride (GaN) FET, although Silicon carbide (SiC) devices can also be used. The normally-off power switch 104 in this example is a silicon MOSFET (metal-oxide-semiconductor field-effect transistor). Use of such devices can be well suited for power electronic applications because GaN and SiC power semiconductors can have superior device characteristics compared to Silicon-based switches.

Basic GaN and unipolar SiC power semiconductors, such as the normally-on power switch 102, are depletion-mode (normally-on) switches/devices. Introducing additional layers in the layer stack of such a power semiconductor to make the device normally-off can result in device performance penalties. Therefore cascoding high-voltage GaN/SiC switches (such as the normally-on power switch 102) with conventional low-voltage silicon MOSFETs (such as the normally-off power switch 104) is a viable option to combine the advantages of Silicon and GaN/SiC power devices. Example advantages of the GaN/SiC power devices include lower switching losses, and they can be physically smaller than an equivalent silicon device for handling the same amount of power. An example advantage of the silicon devices is that they are normally-off.

Another advantage of the cascade transistor circuit 100 is the fact that a standard gate driver can be used. This is because the DC characteristics of the cascode transistor circuit 100 are mainly defined by the silicon MOSFET (the normally-off power switch 104). Therefore the cascode transistor circuit 100 can be used as a direct replacement for silicon MOSFETs or IGBTs (insulated-gate bipolar transistor).

In the cascode transistor circuit 100 of FIG. 1, only the normally-off power switch 104 is controlled actively by a gate driver signal 106 ($V_{GM}$). The normally-on power switch 102 is controlled indirectly via the normally-off power switch 104 because the drain-to-source voltage of the normally-off power switch 104 equals the source-to-gate voltage of the normally-on power switch 102.

In many applications the slope of the voltage across a power switch while switching needs to be controlled for electromagnetic compatibility (EMC) reasons. The voltage across the cascode transistor circuit 100 is the voltage between the drain of the normally-on power switch 102 and the source of the normally-off power switch 104. One or more of the examples that follow can advantageously enable the slope of the voltage across a cascode transistor circuit to be controlled.

FIG. 2 shows a cascode transistor circuit 200 comprising a drain output terminal 206 and a source output terminal 208. The cascode transistor circuit 200 includes a normally-on switch 202, which in the examples that follow can be a SiC or GaN FET. The normally-on switch 202 has a normally-on control terminal 210 and a normally-on conduction channel.

The cascode transistor circuit 200 also includes a normally-off switch 204, which in the examples that follow is a MOSFET. The normally-off switch 204 has a normally-off control terminal 212 and a normally-off conduction channel. The normally-off control terminal 212 is configured to receive a normally-off control signal. The normally-off conduction channel of the normally-off switch 204 is connected in series with the normally-on conduction channel of the normally-on switch 202 between the drain output terminal 206 and the source output terminal 208. The normally-on switch 202 and the normally-off switch 204 can together be considered as a cascoded switch 201.

The cascode transistor circuit 200 of FIG. 2 also includes a controller 214, which has a controller output terminal 216 for providing a normally-on control signal to the normally-on control terminal 210 of the normally-on switch 202. The normally-on control signal for the normally-on switch 202 is independent of the normally-off control signal for the normally-off switch 204, as described in more detail below. This can be advantageous because switching losses and driver losses can be reduced when the normally-off switch 204 is permanently turned on and only the normally-on switch 202 is controlled.

The controller 214 includes a first current source 226 and a second current source 228. In this example they are shown as variable current sources that can be set at a certain level to provide a desired slope (dV/dt) characteristic of the cascoded switch 201. The slope (slewrate) $dV/dt = I_{control}/C_{feedback}$, where $C_{feedback}$ is the capacitance between the drain output terminal 206 and the controller output terminal 216, and $I_{control}$ is the current of the normally-on control signal at the controller output terminal 216. Therefore, $I_{control}$ can be used to directly control the desired behaviour of the slope of the voltage across the cascoded switch 201 (dV/dt).

If both positive and negative slope of the voltage across the cascoded switch 201 is to be controlled, then a bidirectional action can be provided by the first current source 226 and the second current source 228. One of the current sources is switched on to turn-on the normally-on switch 202 (and hence turn-on of the cascoded switch 201), the other current source is switched on to turn-off the normally-on switch 202 (and hence turn-off of the cascoded switch 201). The first current source 226 can therefore provide the normally-on control signal as a first fixed current signal for switching on the normally-on switch 202. The second current source 228 can therefore provide the normally-on control signal as a second fixed current signal for switching off the normally-on switch 202. The first fixed current signal may be of opposite polarity to the second fixed current signal.

During the slope, a linear-circuit operation can exist where the whole control current flows through the feedback capacitance. A larger/smaller slope would provide a larger/smaller current through the feedback capacitance. The difference between $I_{control}$ and $I_{feedback}$ will adjust the voltage at the normally-on control terminal 210 of the normally-on switch 202 to a value such that $I_{control} = I_{feedback}$.

In many applications, it may not be necessary to adjust the level of the first current source 226 and the second current source 228 during use. Instead, the level of the first current source 226 and the second current source 228 can be set at a certain level before the controller 214 is used. With ideal components, a quasi-static condition exists where $I_{control} = I_{feedback}$ (that is, the current through the feedback capacitance). However, $I_{control}$ needs not necessarily be a constant current; it can be an objective to keep the frequency spectrum at the output to be within certain limits.

Also shown in FIG. 2 is a bootstrap circuit 218 connected between the controller output terminal 216 and the normally-on control terminal 210 of the normally-on switch 202. The bootstrap circuit 218 includes a bootstrap capacitor and a bootstrap diode, as will be discussed in more detail below with reference to FIG. 3. The bootstrap circuit 218 can enable a single driver circuit to be used to drive both the normally-on switch 202 and the normally-off switch 204.

That is, a single driver circuit can be used to provide a positive drive voltage to the normally-off switch 204 and also to provide a negative drive voltage to the normally-on switch 202.

The cascode transistor circuit 200 includes a feedback capacitance between the drain output terminal 206 and a control node in a circuit path between the controller output terminal 216 and the normally-on control terminal 210 of the normally-on switch 202. In this example a feedback capacitor 220 is provided in series between the drain output terminal 206 and the controller output terminal 216. That is, the control node is the controller output terminal 216. The feedback capacitor 220 can be a discrete component that is independent of the normally-on switch 202. In some examples, the control node may be (additionally or alternatively) the normally-on control terminal 210 of the normally-on switch 202. Also, the capacitance may be a parasitic/inherent property of the normally-on switch 202.

In the example of FIG. 2, the feedback capacitance, in combination with the independence of the normally-on control signal and the normally-off control signal, can advantageously enable the circuit path between the controller output terminal 216 and the drain output terminal 206 to be formed by: (i) the series connection of the bootstrap capacitor and a parasitic capacitance of the normally-on switch 202; in parallel with (ii) the feedback capacitor 220. This circuit path can enable the overall feedback capacitance to adequately control the rate of change of voltage at the drain output terminal 206 (dV/dt) in accordance with a received normally-on control signal, where the normally-on control signal is a current signal. The feedback capacitance may have a known, and in some examples substantially constant, relationship between current (the current provided as the normally-on control signal) and rate of change of voltage (dV/dt) over a range of voltages. That is, the feedback capacitance may be substantially voltage-independent for voltage levels that correspond to the output voltage. In this way, the current level of the normally-on control signal can be set at a value that results in a desired rate of change of voltage (dV/dt). This can be referred to as slope control because the slope/gradient of the voltage across the cascoded switch 201 can be controlled as the cascode transistor circuit 200 is switched on and off.

In some examples, some voltage dependence in the feedback capacitance may be permitted, especially if it is known and therefore can be accounted for. Also, any voltage dependence should not be too strong because otherwise the normally-on control signal may need to be set to an impractical level. The feedback may be considered substantially voltage-independent if the corresponding variation in rate of change in voltage is within bounds determined by the application. It will be appreciated that an application can have a certain minimum and maximum allowed dV/dt. If we consider that the current provided by the driver is constant, then a minimum capacitance value corresponds to a maximum dV/dt and a maximum capacitance value corresponds to a minimum dV/dt.

In some examples the series connection of the bootstrap capacitor and the parasitic capacitance of the normally-on switch 202 may be sufficient to provide an adequate overall feedback capacitance. That is, the feedback capacitor 220 may not be required, and therefore can be considered as optional.

FIG. 2 also shows a driver block 219 that can provide the normally-off control signal to the normally-off control terminal 212. The driver block 219 is described in more detail below with reference to FIG. 6.

FIG. 3 illustrates another cascode transistor circuit 300. The circuit can be considered as a bootstrap slope-controlled cascode. Features that have already been described with reference to FIG. 2 have been given corresponding reference numbers in the 300 series, and will not necessarily be described again here.

The normally-on switch in this example is a GaN or SiC FET 302, which are examples of depletion mode FETs/switches. The normally-off switch is a silicon MOSFET 304. The normally-on conduction channel of the GaN or SiC FET 302 extends between a normally-on drain terminal and a normally-on source terminal of the SiC or GaN FET. The normally-on drain terminal is connected to the drain output terminal 306, and the normally-on source terminal is connected to the normally-off conduction channel of the MOSFET 304. The normally-off conduction channel of the MOSFET 304 extends between a normally-off source terminal and a normally-off drain terminal of the MOSFET 304. The normally-off source terminal is connected to the source output terminal 308, and the normally-off drain terminal is connected to the normally-on source terminal of the GaN or SiC FET 302. The gate terminal of the GaN or SiC FET 302 is an example of a normally-on control terminal. The gate terminal of the MOSFET 304 is an example of a normally-off control terminal.

In FIG. 3, the bootstrap capacitor 322 is shown connected in series between the controller output terminal 316 and the normally-on control terminal 310. The bootstrap diode 324 is connected in series between the normally-on control terminal 310 and the source output terminal 308. In this example, the bootstrap diode 324 is shown as integrated circuit with the GaN or SiC FET 302, although the bootstrap diode 324 could be provided separately.

Advantageously, the bootstrap diode 324 may be implemented as an active diode in order to reduce losses and enable a higher voltage to be dropped across the bootstrap capacitor 322. It will be appreciated that the bootstrap diode 324 is an example of a bootstrap rectifier, which may be a diode, an active diode, or any other component that performs rectification.

The voltage at the source output terminal 308 can be considered as zero.

The controller 314 is a current-output gate driver in this example. The controller 314 includes a current control block 330, a first current source 326 and a second current source 328.

During normal operation, the MOSFET 304 is permanently turned on by a driver voltage $V_{DRV}$, which is an example of a normally-off control signal that is provided to the gate 312 of the MOSFET 304. That is, a normally-off control signal is configured to control the normally-off switch such that it is closed during normal operation. During an on-state of the cascoded switch 301, the controller output terminal 316 (G) provides a voltage of $V_{DRV}$. Therefore, the bootstrap capacitor 322 is charged by controller 314 to a voltage level of $(V_{DRV}-V_{diode})$, where $V_{diode}$ denotes a forward voltage that is dropped across the bootstrap diode 324. When the cascoded switch 301 is initially switched to an off-state, the voltage at the gate 310 (GH) of the GaN or SiC FET 302 is low, in some examples about zero. When turning off the cascoded switch 301, the node voltage at the controller output terminal 316 (G) is changed from $V_{DRV}$ to 0 by the driver. As a result, the voltage at the gate 310 (GH) of the GaN or SiC FET 302 will change to a negative voltage of $-(V_{DRV}-V_{diode})$. This negative voltage will turn off the GaN or SiC FET 302 and therefore will also turn off the cascoded switch 301.

For regular power MOSFETs, the slope of the drain-source voltage ($V_{ds}$) can be controlled by controlling the current ($I_{gd}$) through the parasitic gate-drain capacitance ($C_{gd}$) using the fact that $dV_{ds}/dt=I_{gd}/C_{gd}$, where $I_{gd}$ is provided to the gate 310 of the GaN or SiC FET 302 by the controller 314 as a normally-on control signal. For the cascoded switch of FIG. 1 this is not trivial. Therefore, applying a similar slope-control technique to the cascoded switch 301 of FIG. 3 will lead to slope control of the drain of the low-voltage MOSFET 304. However, the slope of the GaN or SiC FET 302 (which is an example of a high-voltage normally-on device) may still be uncontrolled. Therefore, the slope of the voltage across the cascoded switch 301 may also be uncontrolled. As indicated above, in some applications the slope of the voltage across the cascoded switch 301 is important for meeting EMC requirements.

In examples that do not have a feedback capacitor 320 ($C_{slope}$) connected between the controller output terminal 316 and the drain output terminal 306 (or the gate 310 of the GaN or SiC FET 302), the ability to adequately control the dV/dt of the cascoded switch 301 can depend upon the parasitic capacitance of the GaN or SiC FET 302 between its gate and drain terminals ($C_{gd}$). In some examples, if only the normally-off switch is controlled directly, and the normally-on switch is indirectly controlled by the normally-off switch, then the voltage slope across the cascoded switch may be considered uncontrollable without the addition of a feedback capacitor 320 and/or providing the normally-on control signal and the normally-off control signal such that they are independent of each other.

The gate 312 of the MOSFET 304 is shown as disconnected from the controller 314 to illustrate that the normally-off control signal that is provided to the gate 312 of the MOSFET 304 is independent of the normally-on control signal that is provided to the gate 310 of the GaN or SiC FET 302. This means that the path from the controller output terminal 316 (which may also be referred to as a driver output) to the drain of the GaN or SiC FET 302 is formed by the series connection of the bootstrap capacitor 322 and $C_{gd}$ of the GaN or SiC FET 302.

In some examples, the overall capacitance can be dominated by $C_{gd}$. If $C_{gd}$ is highly voltage dependent, then adequate slope control may not be achievable by only controlling the current level of the normally-on control signal that is provided to the gate 310 of the GaN or SiC FET 302. Inclusion of the feedback capacitor 320 can enable an overall feedback capacitance to be achieved that is adequately constant such that slope control based on the current level of the normally-on control signal can be achieved. If Cgd is adequately constant then an additional feedback capacitor 320 may not be needed.

In some examples however, a voltage dependent $C_{gd}$ can be considered acceptable, especially if an approximate relationship between current (I) and rate of change of voltage (dV/dt) is known. In a fully-integrated system (that is, with the controller 314 and the cascoded switch 301 provided together in one package) some internal shaping of the drive-current vs. time could be conceived. That is, the driver current can be changed during switching within a fully integrated system. When only $C_{gd}$ is used for slope control, a possible too strong voltage-dependency could be detrimental. It will be appreciated that tolerances are acceptable, but may advantageously be compensated by high accuracy in other circuit parts.

Use of the circuit of FIG. 3 (with an always-on low-voltage MOSFET 304, and inclusion of a feedback capacitor 320) can achieve several advantages compared to driving the cascade circuit of FIG. 1. This will be described in the following section.

FIG. 4 shows simulation results for the circuit of FIG. 3. The top plot in FIG. 4 is the voltage across the cascoded switch $V_{ds}$ 402. The middle plot shows two lines: a first line that represents the conductivity of the first current source 404 and a second line that represents the conductivity of the second current source 406. The conductivity of a current source is non-zero when it is providing a current. When the conductivity of a current source is zero, it could either be indicative of the current source being switched off, or it being switched on but not providing a current (zero voltage across a transistor operated as current source). As discussed above, the second current source is switched on and the first current source is switched off when it is desired to switch the cascoded switch off. Similarly, the second current source is switched off and the first current source is switched on when it is desired to switch the cascoded switch on. As can be seen from FIG. 4, the respective current sources only conduct current during a transition in $V_{ds}$ 402, after which the circuit is in a quasi-static state of operation and little or no further current is drawn from the active current source.

The bottom plot in FIG. 4 is the current through the feedback capacitor 408. It can be seen that current only flows through the feedback capacitor during the transition in $V_{ds}$ 402. The current through the feedback capacitor 408 is less than the current supplied by the current source that is active at the corresponding time because some of the current is also provided as the control signal to the normally-on GaN or SiC FET. Once the GaN or SiC FET has received sufficient current at its gate to switch on, all of the current that is provided by the current source charges the feedback capacitor.

FIG. 5 shows a plurality of simulation results for the circuit of FIG. 3. Each of the simulation results are overlaid with each other and show the same signals as shown in FIG. 4 with corresponding reference numbers in the 500 series. The different results represent the current sources being set to supply different drive currents.

FIG. 5 shows that as the drive current is varied (due to the different amplitudes of the signal that represents the conductivity of the first current source 504, and the signal that represents the conductivity of the second current source 506), the slope of $V_{ds}$ 502 changes. This illustrates that the circuit of FIG. 3 can be used to provide adequate slope control and therefore can be used to satisfy various EMC requirements.

The same circuit parameters and component values are used for each of the simulations that are shown in FIG. 5. Therefore, it will be appreciated that the area under the curves 504, 506 for the conductivity of the first and second current sources will be the same because they are used to provide control signals to the same GaN or SiC FETs and charge the same feedback capacitors. That is, if the current source is set to a lower current value then it will take longer to fully charge the feedback capacitance; therefore the current source will be actively providing a current for longer.

Cascaded switches can have disadvantages that hamper their use in power conversion applications. As will be described below, sometimes with reference to FIGS. 4 and 5, one or more of the circuits disclosed herein can address the following problems:
  $V_{ds}$-overshoot.
  EMC problems associated with too high a rate of change of voltage (too fast dV/dt) and/or with too high a rate of change of current (dI/dt).

Uncontrollable gate resistor in cascoded switches with integrated driver.

Higher switching and driving losses.

$V_{ds}$-Overshoot

For the cascode circuit of FIG. 1, the voltage $V_{ds}$ across the cascoded switch ideally rises to the supplied DC voltage during turn-off. However, in practice, $V_{ds}$ can become significantly higher due to parasitic inductances, which can result in overshoot and undesired ringing/oscillations in the $V_{ds}$ signal. This overshoot can require overrating the breakdown voltage of the cascaded switch. Also the oscillations following the overshoot may lead to EMC problems in some applications. The gate current of the low-voltage MOSFET can also present undesirable large oscillations.

The simulation results of FIG. 4, which represent operation of the circuit of FIG. 3, shows very little ringing and overshoot in all of the signals, including the $V_{ds}$ signal—the signals settle to a new constant value very quickly after a transition in the signal value. As described above, the slope of $V_{ds}$ is controlled by supplying a fixed current from the driver. The fixed current can prevent or reduce fluctuating currents through the feedback capacitor and $C_{gd}$ of the GaN or SiC FET (the normally-on device), and can also reduce the overshoot and the ringing at the drain of the cascaded switch (as shown by the $V_{ds}$ signals).

EMC Problems with too Fast dV/dt or dI/dt

Switching voltages with perfect square waves are very good for efficiency but also result in a large radiation spectrum. There are several EMC regulations that prohibit this radiation as otherwise other circuits would suffer because of it. By creating a trapezoidal waveform instead of square waves, the higher harmonics in the radiated spectrum are significantly reduced, thereby addressing EMC problems.

As mentioned above, controlling the slope of the voltage across the cascaded switch can be achieved by controlling the current to $C_{gd}$ in a regular MOSFET. However, if the low-voltage MOSFET in the cascade configurations of FIG. 1 has a large $C_{gd}$, then adequate slope control can be difficult to achieve. For the circuit of FIG. 3 however, adequate slope control can be achieved, as shown by the simulation results of FIG. 5. FIG. 5 shows that different driver output currents can be used (the middle curves) to obtain different effective slopes of the voltage $V_x$ (top curve, $V_{ds}$ across cascoded switch). As shown in the bottom curves, different slopes are obtained because different currents flow through added feedback capacitor.

Uncontrollable Gate Resistor in Cascoded Switches with Integrated Driver

When using an integrated gate driver, it may not be possible to change a gate resistor to prevent overshoot or to control the slope for EMC reasons. This technique may be applied on a printed circuit board (PCB) when using an external driver. For circuits disclosed herein, the slope can be programmed externally and overshoots can be removed or reduced while using an integrated driver. An integrated driver can comprise a control circuit to drive a power switch, which is integrated together with the power switch in one package. Especially for modern power-switch technologies such as GaN and SiC switches, having an integrated driver can be very important for enabling use of the higher switching frequencies that the power switches are capable of. When using these new power-switch technologies, obtaining the higher switching frequencies offered by these new technologies may not be possible using external drivers due to high gate-loop parasitic components.

Therefore, use of an integrated gate driver, such as the one illustrated in FIG. 6, can advantageously enable the cascoded switch to be operated at higher switching frequencies.

One or more of the circuits disclosed herein can be used in any power-conversion application in which normally-off switches are used for safety reasons (for example to prevent short circuits under all circumstances) and where using SiC/GaN devices gives a benefit. Many of these SiC/GaN devices show a normally-on behaviour, and therefore using a cascaded switch constellation to that provides an overall normally-off behaviour can be advantageous.

A further example of a cascode transistor circuit 600 is shown in FIG. 6. The general principles of the circuit of FIG. 6 are similar to those of the circuit of FIG. 3. Features that have already been described with reference to FIG. 3 have been given corresponding reference numbers in the 600 series, and will not necessarily be described again here.

In this example, the normally-on control signal provided at the controller output terminal 616 of the controller 614, which may also be referred to as a driver output, is provided by current mirrors that are used to amplify the current signals. The level of the current of these driver outputs is programmable via a current DAC.

FIG. 6 also includes a charge pump capacitance, which will be referred to as a charge pump 630. The charge pump 630 is selectively connected either in parallel with the bootstrap capacitor 622 as shown in FIG. 6, or is connected to a positive reference voltage (not shown). It will be appreciated that such selective connection can be provided by an appropriately controlled switch (not shown). The charge pump 630 can be used to accommodate for a gate-leakage current of the GaN or SiC FET 602 that otherwise might cause the voltage across the bootstrap capacitor 622 to become too low, especially for long switch-off times. If the voltage across the bootstrap capacitor 622 becomes too low, then the power switch could be unintentionally switched on.

The charge pump 630 is configured to maintain a negative voltage across the bootstrap capacitor 622 when the cascode transistor circuit is off. When the GaN or SiC FET 602 is supposed to remain off, a negative gate voltage needs to be maintained. The charge pump 630 can be used to keep the bootstrap capacitor 622 negatively charged and therefore maintain the negative gate voltage. In that case, the charge pump 630 is switched from the positive reference voltage (not shown), where it is charged, to being in parallel with the bootstrap capacitor 622. When the charge pump 630 is connected in parallel with the bootstrap capacitor 622, it is discharged to maintain the negative voltage.

The circuit of FIG. 6 also includes an under-voltage lockout (UVLO) circuit 632. The UVLO circuit 632 can provide the normally-off control signal to the gate 612 of the MOSFET 604 such that the normally-off control signal is configured to turn the MOSFET 604 off before and during start-up, and turn the MOSFET 604 on after one or more voltages within the cascode transistor circuit satisfy one or more associated threshold values. In an idle/off system condition, the cascoded switch should not conduct. Since, the conduction channel of the GaN or SiC FET 602 is conductive when it receives a 0V gate-drive signal (that is, it is normally-on), the MOSFET should then be off, which is the case when it receives a 0V gate-drive signal (because it is normally-off). In the idle/off state the overall cascoded switch should be off, and therefore the normally-off MOSFET 604 should be off. However, since the voltage across the bootstrap capacitor 622 is unknown during startup, the normally-on control signal for the GaN or SIC FET 602 may be low such that the GaN or SiC FET 602 is conducting.

The UVLO circuit 632 monitors various voltage levels, including internal supply voltages and the voltage across the bootstrap capacitor 620, and when they at an appropriate level (for example they are high enough) to enable proper operation of the circuit, the UVLO circuit 632 generates a control signal for the MOSFET 604 such that it is switched on. The GaN or SiC FET 602 can then be switched on and off by the bootstrap circuit. In the same way as discussed above, the slope of the voltage at the drain of the GaN or SiC FET 602 during turn on and turn off is controlled by the current sources in the controller 614. In this way, the cascode transistor circuit 600 starts up with the low-voltage MOSFET 604 turned off, which ensures that the cascoded switch is not conducting irrespective of the voltage across the bootstrap capacitor 622, and hence irrespective of the control signal provided to the normally-on control terminal 610 of the GaN or SiC FET 602.

In the example of FIG. 6, a two-die solution is used to implement the cascode transistor circuit 600. The normally-on optimized power switch (the GaN or SiC FET 602) is implemented on a first die. The low-voltage MOSFET 604, and optionally also the dedicated driver (the controller 614), are implemented on a second, different die. Such a configuration can be advantageous due to the different technologies of the devices and components on the separate dies. In other examples however, one or more of the components of the cascode transistor circuit 600 can be provided on the same die.

Disclosed herein is a driver constellation with a low-voltage MOSFET in series with a normally-on power switch to obtain a normally-off device, with an added capacitor $C_{slope}$ to control the slope of the overall voltage across the cascoded switch. The low-voltage MOSFET can be separately controlled. Slope control can lead to better EMC behaviour. The constellation can be used to actively control the slope of the voltage across the switch by controlling the driver output current.

A cascoded power switch set-up can be provided where a low-voltage MOSFET is only switched on after start-up and then left on and where only the normally-on device is switched using a boot-strap circuit.

A bootstrap circuit can be improved by using an active bootstrap diode and/or a charge-pump circuit to maintain the voltage across the bootstrap capacitor to deal with potentially high gate leakage current of the normally-on device.

Further details of operation of the slew-rate control of a SiC or GaN transistor in the circuit of FIG. 3 or 6 are provided in the following paragraphs.

A simple circuit replacement of the SiC or GaN transistor can be a circuit comprising a controllable current source in parallel with a controllable switch. During slewing, the circuit behaves in a linear-circuit mode; that is, only the controllable current source needs to be considered. When the voltage across the transistor approaches zero, the switch can be closed.

The circuit operation can easiest be considered using Kirchoff's current law, that is, the sum of currents in a circuit node is zero.

Assume the SiC or GaN transistor is fully off and $V_D$ is high (for example 300V). When fully conductive, $V_D$ approaches zero. The control voltage range at the gate is a few Volts near zero, and is negligible with respect to the voltage range of VD. $C_G = C_{GS} + C_{GD}$. Thus, the dV/dt across $C_{slope}$ and $C_{GD}$ are mainly determined by the voltage slope at $V_D$.

When the control current source is switched on, this current splits into a current through $C_{slope}$ and $C_{boot}$. The latter current splits up into currents through $C_{GS}$ and $C_{GD}$. The current into $C_{GS}$ causes $V_G$ to increase and eventually, the SiC or GaN transistor (current source) is turned on. Dependent on the actual load at $V_D$, at a certain level of $V_G$, $V_D$ will slew down. With still increasing $V_G$, the voltage slope at $V_D$ will become steeper and the currents through $C_{slope}$ and $C_{GD}$ will increase. When the sum of the currents through $C_{GD}$ and $C_{slope}$ equal $I_{control}$, $V_G$ remains constant. This is called a quasi-static operation and it will exist until $V_D$ is low and the simple model is not valid anymore (linear area of a MOS).

Thus, the slew-rate at VD is determined by $I_{control}$ and $C_{slope}//C_{GD}$. Since $C_{GD}$ of a SiC or GaN can be relatively low (which is a reason why such a transistor is attractive), the slew-rate is mainly determined by $C_{slope}$. Increasing $C_{GD}$ by transferring $C_{slope}$ as a parallel component with $C_{GD}$ can result in the desired action. However, then the current through $C_{boot}$ will increase, causing a larger and potentially unwanted charge transfer into $C_{boot}$.

When switching off the SiC or GaN transistor, a reverse direction of the control current must be applied and a similar description can be made of the sequence of events. Again, a quasi-static condition exists when the current into $C_{GS}$ has become zero since the other currents into node G sum up to zero as well.

It will be appreciated that any components that are described or illustrated herein as being coupled or connected could be directly or indirectly coupled or connected. That is, one or more components could be located between two components that are said to be coupled or connected whilst still enabling the required functionality to be achieved.

It will be appreciated that any reference to "higher than", "lower than", "close to", "before", "shortly before", "after" or "shortly after", etc, can refer to the parameter in question being less than or greater than a threshold value, or between two threshold values, depending upon the context.

The invention claimed is:

1. A cascode transistor circuit comprising:
    a drain output terminal;
    a source output terminal;
    a depletion-mode switch including a normally-on control terminal and a normally-on conduction channel;
    a normally-off switch including a normally-off control terminal and a normally-off conduction channel, wherein the normally-off control terminal is configured to receive a normally-off control signal, and wherein the normally-off conduction channel is connected in series with the normally-on conduction channel between the drain output terminal and the source output terminal;
    a controller including a controller output terminal configured to provide a normally-on control signal for the normally-on control terminal of the depletion-mode switch, wherein the normally-on control signal is controlled independent of the normally-off control signal;
    a negative voltage source configured to provide a negative voltage to the normally-on control terminal of the depletion-mode switch, wherein the negative voltage source includes a bootstrap circuit connected between the controller output terminal and the normally-on control terminal of the depletion-mode switch; and
    a feedback capacitance between the drain output terminal and a control node in a circuit path between the controller output terminal and the normally-on control terminal of the depletion-mode switch.

2. The cascode transistor circuit of claim 1, wherein the normally-on control signal is a current signal, and the feedback capacitance is configured to control the rate of change of voltage at the drain output terminal (dV/dt) in accordance with the current of the normally-on control signal.

3. The cascode transistor circuit of claim 2, wherein the normally-on control signal is a first fixed current signal for switching on the depletion-mode switch, and wherein the normally-on control signal is a second fixed current signal for switching off the depletion-mode switch.

4. The cascode transistor circuit of claim 1, wherein the feedback capacitance is substantially constant over an expected voltage range across the normally-on conduction channel.

5. The cascode transistor circuit of claim 1, wherein the feedback capacitance comprises a capacitance between the controller output terminal and the drain output terminal.

6. The cascode transistor circuit of claim 1, wherein the feedback capacitance comprises a capacitance between the normally-on control terminal and the drain output terminal.

7. The cascode transistor circuit of claim 6, wherein the capacitance comprises a component that is independent of the depletion-mode switch.

8. The cascode transistor circuit of claim 7, wherein the capacitance is a discrete component.

9. The cascode transistor circuit of claim 6, wherein the capacitance comprises a parasitic capacitance of the depletion-mode switch.

10. The cascode transistor circuit of claim 1, wherein the bootstrap circuit comprises a bootstrap capacitor and a bootstrap rectifier, wherein:

the bootstrap capacitor is connected in series between the controller output terminal and the normally-on control terminal of the depletion-mode switch; and the bootstrap rectifier is connected in series between the normally-on control terminal of the depletion-mode switch and the source output terminal.

11. The cascode transistor circuit of claim 10, further comprising a charge pump capacitance in parallel with the bootstrap capacitor, wherein the charge pump capacitance is configured to maintain a negative voltage across the bootstrap capacitor when the cascode transistor circuit is off.

12. The cascode transistor circuit of claim 1, wherein the normally-off control signal is configured to control the normally-off switch such that it is turned on during normal operation.

13. The cascode transistor circuit of claim 1, further comprising an under-voltage lockout (UVLO) circuit configured to provide the normally-off control signal such that the normally-off control signal is arranged to turn the normally-off switch off before and during start-up, and optionally during any fault condition, and turn the normally-off switch on after one or more voltages within the cascode transistor circuit satisfy one or more associated threshold values.

14. The cascode transistor circuit of claim 1, wherein the depletion-mode switch is provided on a first die, and the normally-off switch is provided on a second, different, die.

15. The cascode transistor circuit of claim 14, wherein the controller is also provided on the second die.

* * * * *